(12) United States Patent
Bertrand et al.

(10) Patent No.: US 6,385,096 B1
(45) Date of Patent: May 7, 2002

(54) MEMORY INCORPORATING COLUMN REGISTER AND METHOD OF WRITING IN SAID MEMORY

(75) Inventors: Bertrand Bertrand, Trets; David Naura; Sébastien Zink, both of Aix en Provence, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/952,904

(22) Filed: Sep. 13, 2001

Related U.S. Application Data

(62) Division of application No. 09/675,366, filed on Sep. 29, 2000, now Pat. No. 6,307,792.

(30) Foreign Application Priority Data

Sep. 29, 1999 (FR) .......................................... 99 12149

(51) Int. Cl.[7] ................................................ G11C 7/00
(52) U.S. Cl. ............................ 365/189.05; 365/189.01; 365/185.23; 365/218
(58) Field of Search ....................... 365/189.01, 189.05, 365/230.01, 185.23, 218

(56) References Cited

U.S. PATENT DOCUMENTS

| | | | |
|---|---|---|---|
| 4,388,702 A | 6/1983 | Sheppard | |
| 4,887,242 A | 12/1989 | Hashimoto | |
| 5,587,951 A | 12/1996 | Jazayeri et al. | |
| 5,615,149 A | 3/1997 | Kobayashi et al. | |
| 5,677,873 A | 10/1997 | Choi et al. | |
| 5,812,463 A | 9/1998 | Palk | |
| 5,835,414 A | 11/1998 | Hung et al. | |
| 5,859,804 A | * 1/1999 | Hedberg et al. | ............ 365/201 |
| 5,999,451 A | 12/1999 | Lin et al. | |
| 6,021,069 A | 2/2000 | Hung et al. | |
| 6,026,505 A | * 2/2000 | Hedberg et al. | ............ 714/711 |
| 6,032,248 A | 2/2000 | Curry et al. | |
| 6,052,305 A | 4/2000 | Yang et al. | |
| 6,307,792 B1 | * 10/2001 | Bertrand et al. | ....... 365/189.05 |

FOREIGN PATENT DOCUMENTS

JP    362080899 A  *  4/1987

OTHER PUBLICATIONS

French Search Report dated Jun. 16, 2000 with Annex to French Application No. 99–12149.

\* cited by examiner

*Primary Examiner*—Viet Q. Nguyen
(74) *Attorney, Agent, or Firm*—Lisa K. Jorgenson; Jose Gutman Fleit, Kain, Gibbons, Gutman & Bongini P.L.

(57) ABSTRACT

A column register of an integrated circuit memory, notably in EEPROM technology, is utilized in a method of writing a data word of $2^p$ bits in the memory, where p is a non-zero whole number. The method includes the following steps:

1) erasing all the cells of the word;
2) loading $2^q$ data in $2^q$ high-voltage latches (HV1, HV3, HV5, HV7), and loading $2^p-2^q$ other data in the $2^p-2^q$ low-voltage latches (LV0, LV2, LV4, LV6); and
3) programming $2^q$ cells of the memory (M0, M2, M4, M6) as a function of the data memorized in the $2^q$ high-voltage latches;

as well as repeating $2^{p-q}-1$ times the following steps:

4) loading, in the $2^q$ high-voltage latches, of $2^q$ other data that were loaded in the $2^q$ low-voltage latches at step 2); and
5) programming $2^q$ other cells of the memory (M1, M3, M5, M7) as a function of the data memorized in the $2^q$ high-voltage latches.

7 Claims, 3 Drawing Sheets

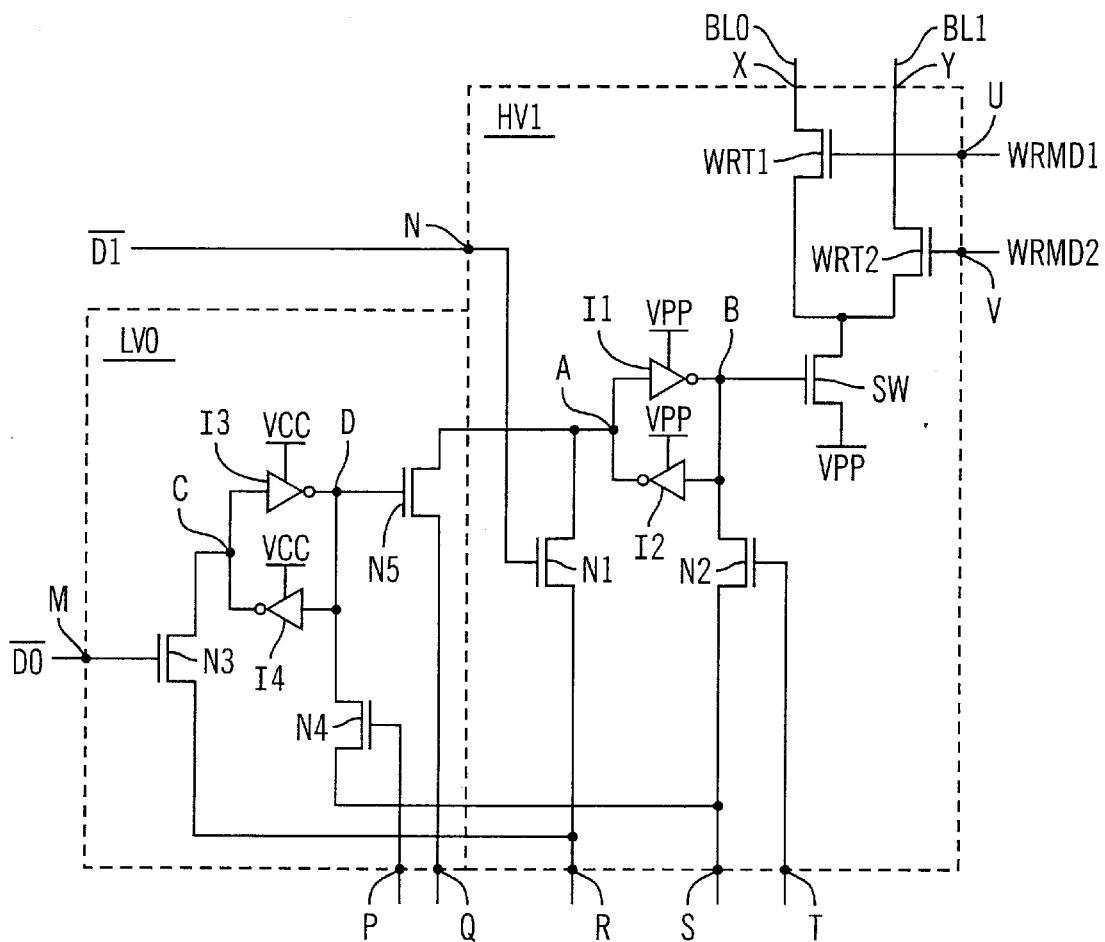
FIG. 5
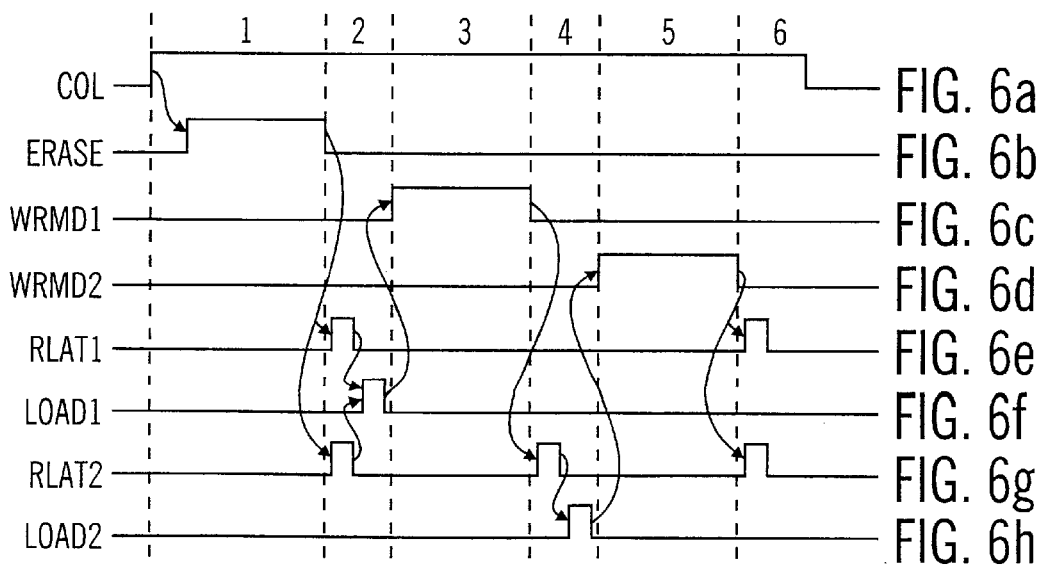

MEMORY INCORPORATING COLUMN REGISTER AND METHOD OF WRITING IN SAID MEMORY

This is a divisional of application Ser. No. 09/675,366, filed Sep. 29, 2000, now U.S. Pat. No. 6,307,792. The entire disclosure of prior application Ser. No. 09/675,366 is herein incorporated by reference.

CROSS-REFERENCE TO RELATED APPLICATIONS

This application is based upon and claims priority from prior French Patent Application No. 99-12149, filed Sep. 29, 1999, the entire disclosure of which is herein incorporated by reference.

BACKGROUND OF THE INVENTION

1. Field of the Invention

The present invention generally relates to memory devices, and more particularly to a column register suitable for an integrated circuit memory for instance in EEPROM technology, of the serial or parallel type, and a method of writing in said memory.

2. Description of the Prior Art

Such a memory contains cells arranged in a matrix of rows and columns. A memory cell memorizes the value of one bit in the memory. The cells of a same column are connected to a same connection line, classically depicted vertically and called bit line. Also, cells of a same row are connected to a same connection line, classically depicted horizontally and called word line.

As shown in FIG. 1, a cell M comprises a floating gate transistor TGF forming a non-volatile memorization element whose drain is connected to the bit line BL via a selection transistor TS, which is an N-type MOS transistor. In operation, the sources of the floating gate transistors of a same line are connected to ground, in general via another selection transistor (not shown) common to several adjacent cells. The gate of the floating gate transistor TGF is connected to a command gate line CG. That of the selection transistor TS is connected to the word line WL.

The erasure and programming of an EEPROM cell are obtained by the tunnel ("Fowler Nordheim") effect. To this end, a high programming voltage VPP on the order of 18 volts is generated by any adapted means from the memory's supply voltage VCC, which is on the order of 5 volts.

An erased cell is a cell in which the floating gate of transistor TGF is negatively charged. In order to erase a cell, it is then necessary to supply it with voltages enabling to "trap" free electrons of the floating gate. Accordingly, it is necessary to apply the voltage VPP on line CG and on line WL, and to apply a zero voltage on line BL or to set that line to a high impedance state. The erased state of a cell corresponds for example to the memorization of a binary data 1.

A programmed cell is a cell in which the floating gate of transistor TGF is positively charged. To program a cell, it is therefore necessary to supply it with voltages capable of "snatching" electrons from the floating gate. Accordingly, it is necessary to apply the voltage VPP on line BL and on line WL, and to apply a zero voltage to line CG. The programmed state of a cell corresponds e.g. to the memorization of a binary data 0.

According to the above example, the writing of any binary value in a cell comprises a step of erasing the cell (so that it memorizes the binary data 1), then, when the binary data to be written is 0, a step of programming the cell. The initial erasure step at the programming step serves to control the charge of the floating gate under all circumstances. The programming step is conditional in the sense that it only takes place if the binary data to be written is 0.

In order to implement the programming step, the memory comprises, for each bit line, a high-voltage memorization and switching latch, or more simply a high-voltage latch. This latch forms part of a register known as a bit line register or a column register. Such a latch has a twofold function. Firstly it serves to memorize a binary data for the purpose of writing in a cell. Secondly, it serves to bring the bit line to which the cell is connected to voltage VPP, if the binary data to be written is 0. This second function of the latch is referred to as conditional switching.

FIG. 2 shows the diagram of a high voltage latch as known in the state of the art.

The latch BHT shown in FIG. 2 first of all comprises high voltage memorization means for provisionally memorizing a binary data 1 or 0, respectively in the form of a high voltage VPP or a zero voltage.

These means classically comprise two inverters I1 and I2 connected "head-to-tail" between a node A and a node B so as to produce a memorization effect. They are high voltage inverters in the sense that they can receive and deliver a voltage of either zero or VPP. They are classically CMOS technology inverters, i.e. they comprise a P-type MOS transistor and an N-type MOS transistor in series between the high voltage source VPP and ground, the gates of the two transistors being connected together and the output of the inverter being taken at the node corresponding to the common source of the two transistors. By convention, the output of the memorization means is taken at node B and their input is taken at node A. In other words, the binary data stored by the latch is 0 when node B is brought to the zero potential (ground potential) and is 1 when node B is brought to the high voltage VPP (potential referenced with respect to ground).

The high voltage latch BHT also comprises loading means, for loading a binary data in the high voltage memorization means.

These loading means firstly comprise an N-type transistor designated N1 connected to node A by its drain and to a node R by its source. In operation, the node R is connected to ground via a selection transistor (not shown). The gate of transistor N1 receives a signal DATA bar which is a low voltage signal (i.e. whose level is either zero or equal to VCC) representing the inverse of the binary data to be written. In other words, the level of signal DATA bar is zero if the binary data to be written is 1 and is equal to VCC if the binary data to be written is 0. When its level is equal to VCC, the signal DATA bar serves to bring node B to the VPP voltage, which loads the binary value 1 into the high voltage memorization means I1, I2.

Secondly, the loading means comprise another N-type MOS transistor, designated N2, having its drain connected to node B and its source to node S. In operation, the node R is connected to ground either directly or via another selection transistor (not shown). The gate of transistor N2 is connected to a node T to receive a reset to zero signal RLAT, which is also a low voltage signal. When its level is at VCC, this signal serves to bring node B to ground potential, so loading the binary value 0 into the memorization means I1, I2.

The loading of a binary data in the memorization means I1, I2 is carried out in two stages: at a first stage, the signal RLAT passes to VCC, so connecting node B to ground via the transistor N2 which is conducting, so that a 0 is loaded into the memorization means I1, I2; The signal RLAT then returns to zero to block transistor N2; at a second stage, the inverse of the binary data to write is brought to the gate of transistor N1 by means of the signal DATA bar, so that node A is brought to ground potential via transistor N1 only when the binary data to be written is 0, which then has the effect of loading the binary value 1 into the memorization means I1, I2.

The high voltage latch BHT further comprises conditional switching means to bring or not bring to the voltage VPP the bit line BL to which the cell is connected depending on the value memorized by the high voltage memorization means.

These conditional switching means comprise an N-type MOS transistor designated SW connected by its gate to the output of the high voltage memorization means I1, I2 (i.e. at node B), to the bit line BL by its source and by its drain to the high voltage supply source VPP via an N-type MOS transistor designated WRT. The gate of transistor WRT receives a control signal WRMD which makes it conducting during the memory write operations (i.e. in the write mode) and which blocks it during the memory readout operations (i.e. in the read mode). Transistor WRT thus has the function of isolating the bit line BL from the high voltage VPP in the read mode. In the write mode, transistor SW provides the function of conditionally switching the high voltage latch since it allows to bring the bit line BL to the high voltage VPP only when the binary value memorized in the memorization means I1, I2 is 1, that is when the binary data to write is 0.

In general, at least eight binary data are written simultaneously into the memory. These eight binary data form a data word or a binary word. A memory word designates eight adjacent cells of a same line of the memory memorizing the binary word. A memory word therefore memorizes the value of one byte of the memory. In certain cases, several memory words of a same memory line are written simultaneously, sometimes all the words of that line: this is known as page mode writing. In what follows, the term "word" shall sometimes be used in isolation to designate either a binary word or a memory word, depending on the context.

Writing a binary word in the memory comprises a step of simultaneously erasing all the cells of the memory word (so that they memorize the binary data 1), then a step of conditional programming simultaneously for all the cells of the memory word (so that only the thus programmed cells store the binary value 0).

For writing a data word, eight binary bits are loaded into eight high voltage latches such as the one shown in FIG. 2. Indeed, there is in general one such latch per bit line of the memory, to allow the simultaneous writing into all the cells of a same memory word, or even into all the cells of a same memory line (page mode).

Now, the high voltage latches such as shown in FIG. 2 occupy a lot of space on the doped silicon substrate on which the memory is formed, in particular owing to the size of the transistors that must allow them to withstand strong currents and high voltages. As a result, the column register occupies a considerable area of silicon. For low capacity memories (with few memorized bytes), this area is comparable—or even greater—than that occupied by the memory storage space. Thus, in FIG. 3 there is shown schematically the area occupied by the memory storage plane MM of one byte comprising eight memory cells M0 to M7 forming a memory word and the area occupied by the corresponding eight high-voltage latches BHT0 to BHT7. It can be appreciated that this area occupied by the high-voltage latches is penalizing in terms of fabrication cost, especially for low capacity memories.

Accordingly, there exists a need for overcoming the disadvantages of the prior art as discussed above.

SUMMARY OF THE INVENTION

According to a preferred embodiment of the present invention, a preferred implementation will remedy the drawbacks of prior art memories as discussed above. In view of the foregoing, a preferred embodiment of the present invention contemplates a column register suitable for an integrated circuit memory, for instance in EEPROM technology, which comprises, for a memory word having $2^p$ memory cells each connected to a respective bit line:

$2^q$ high-voltage latches, where q is a whole number less than p, each comprising high-voltage memorization means for memorizing a binary data in the form of a high programming voltage or a zero voltage, coupled to conditional and selective switching means, to bring to the high programming voltage a determined bit line among $2^{p-q}$ bit lines; and $2^p-2^q$ low-voltage latches, each comprising low-voltage memorization means for memorizing a binary data in the form of a low supply voltage or a zero voltage, and coupling means at the input of one of the high-voltage latches, Which can be activated to load into the high-voltage latch the binary data memorized in the low-voltage latch.

In an example which shall be detailed below, p is equal to 3 and q is equal to 2. Thus, for a memory word of eight memory cells, the column register in accordance with the invention comprises four high-voltage latches and four low-voltage latches instead of the eight high-voltage of a register according to the state of the art. Now, a low-voltage latch takes up a lot less space on the doped silicon substrate than a high-voltage latch. The invention therefore makes it possible to reduce the space globally occupied by the column register on the silicon substrate.

The invention also concerns a memory, notably in EEPROM technology, comprising a memory plane with at least one memory word of $2^p$ cells, each connected to a respective bit line, which comprises a column register such as defined above.

Moreover, the invention also proposes a method of writing at least one data word of $2^p$ bits in such a memory, which comprises the following steps:

1) erasing all the cells of the memory word;
2) loading $2^q$ data in the $2^q$ high-voltage latches, and loading $2^p-2^q$ other data in the $2^p-2^q$ low-voltage latches;
3) programming $2^q$ cells of the memory as a function of the data memorized in the $2^q$ high-voltage latches;
    as well as repeating $2^{p-q}-1$ times the following steps:
4) loading, in the $2^q$ high-voltage latches, of $2^q$ of the other data that were loaded in $2^q$ low-voltage latches at step 2);
5) programming $2^q$ other cells of the memory as a function of the data memorized in the $2^q$ high-voltage latches.

BRIEF DESCRIPTION OF THE DRAWINGS

Other characteristics and advantages of the invention shall become apparent upon reading the following description.

The latter is purely illustrative and is to be read in conjunction with the appended drawings in which:

FIG. 5 is a detailed diagram of a high-voltage latch and of a low voltage latch in accordance with the invention;

FIGS. 6a to 6h are timing charts of signals that come into play in the write mode of the memory.

DESCRIPTION OF THE PREFERRED EMBODIMENTS

Figure 4:
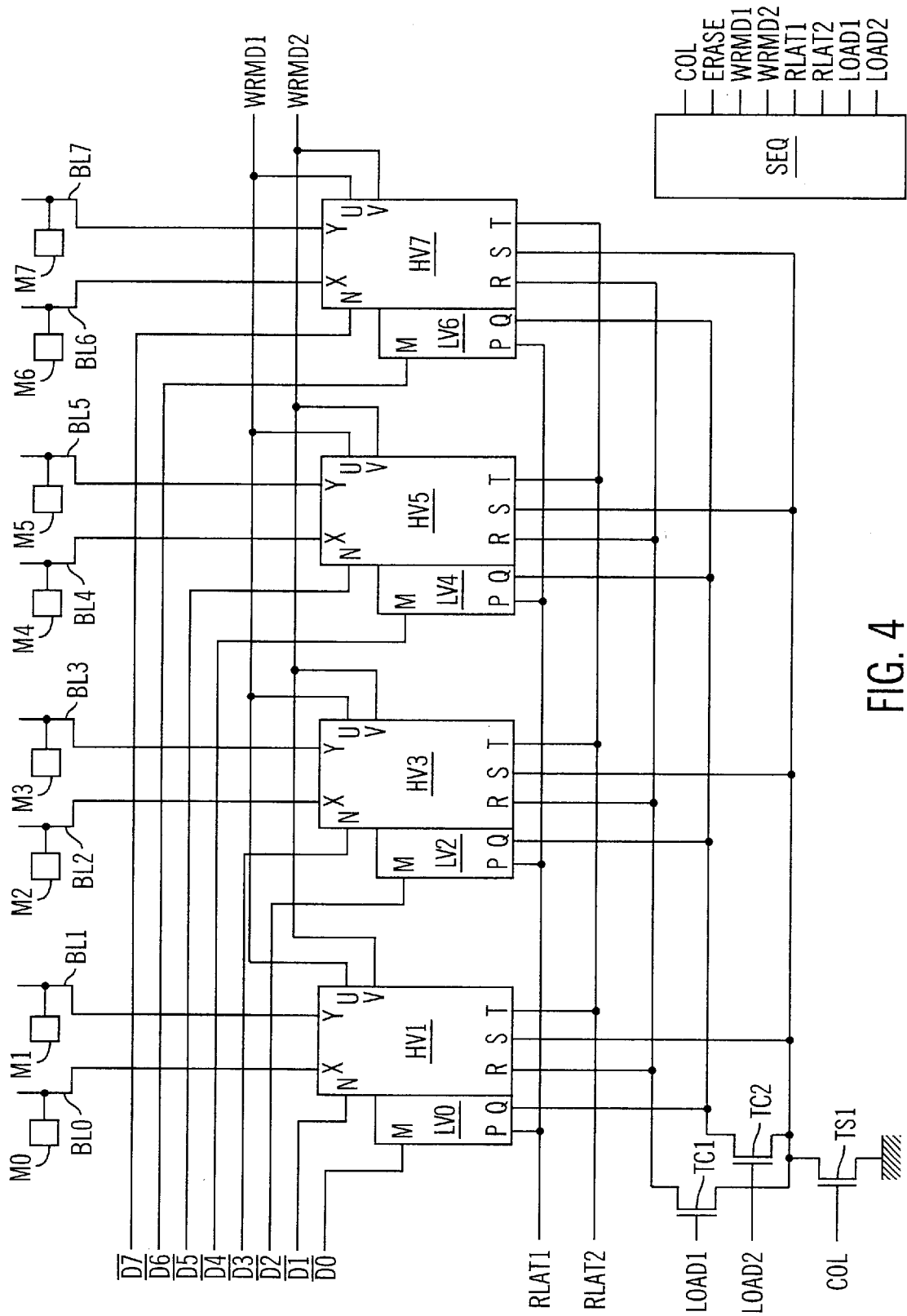
FIG. 4 is a diagram of column registers according to the invention.

FIG. 4 shows the diagram of a column register according to the invention.

For a memory word occupying eight memory cells M0 to M7, each connected to different bit line, respectively BL0 to BL7, the register comprises—in a simple example—four high voltage latches HV1, HV3, HV5 and HV7 and four low voltage latches LV0, LV2, LV4, and LV6. The high voltage latches are slightly different both functionally and structurally from the high voltage latch according to the prior art that was described with reference to FIG. 2.

Signals D0 bar, D2 bar, D4 bar and D6 bar corresponding to the inverse of data to be written are supplied to an input M of the low-voltage latches respectively LV0, LV2, LV4, and LV6. Signals D1 bar, D3 bar, D5 bar and D7 bar corresponding to the inverse of the data to be written are supplied to an input N of the high-voltage latches respectively HV1, HV3, HV5 and HV7.

The high-voltage latches HV1, HV3, HV5 and HV7 comprise two outputs X and Y connected to two respective bit lines of the memory, preferably two adjacent bit lines to limit the length of the connections. These are respectively bit lines BL0 and BL1 for high-voltage latch HV1, BL2 and BL3 for latch HV3, BL4 and BL5 for latch HV5 and finally BL6 and BL7 for latch HV7.

The high-voltage latches HV1, HV3, HV5 and HV7 comprise two inputs U and V respectively receiving a first selection signal WRMD1 and a second selection signal WRMD2. These are high-voltage signals of which only one at a time can have a level equal to VPP. As will be seen in more detail further, these signals allow to select the one of the two bit lines connected to the outputs X and Y of each high-voltage cell which is taken, as the case arises (as a function of the data memorized in the high voltage latch), to the high programming voltage VPP.

Finally, the low-voltage latches LV0, LV2, LV4, and LV6 each comprise inputs P and Q, and the high-voltage latches HV1, HV3, HV5 and HV7 each comprise inputs R, S and T, for which the following shall be noted:

inputs P of the low-voltage latches together receive a first reset to zero signal RLAT1;

inputs T of the high-voltage latches together receive a second reset to zero signal RLAT2;

inputs R of the high-voltage latches are together connected, or not connected, to ground via a first loading transistor TC1 and a selection transistor TS1 when the signal level of a first loading signal LOAD1 and the signal level of a memory word selection signal COL are equal to VCC;

inputs Q of the low-voltage latches are together connected, or not connected, to ground via a second loading transistor TC2 and the selection transistor TS1, when the signal level of a second loading signal LOAD2 and the signal level of the memory word selection signal COL of the binary word are equal to VCC; and inputs S of the high-voltage latches are together connected, or not connected, to ground via the selection transistor TS1, when the level of the word selection signal COL is equal to VCC.

In FIG. 4, there is also shown a sequencer SEQ of the memory, which generates a signal ERASE which shall be discussed later, as well as the above-mentioned signals COL, WRMD1, WRMD2, RLAT1, RLAT2, LOAD1 and LOAD2.

Before describing the operation of the column register in accordance with a preferred embodiment of the present invention, there shall now be described, from both a structural and functional point of view, the high-voltage latches and the low-voltage latches in accordance with the preferred embodiment of the invention. To this end, reference shall be made to FIG. 5 which shows the detailed diagram of the high-voltage latch HV1 and of the low voltage latch LV0. Nevertheless, it is clear that the description that follows applies equally to the other high-voltage latches and to the other low-voltage latches respectively. In FIG. 5, the elements of the high-voltage latch HV1 in accordance with the invention which are identical to the elements of latch BHT of the prior art shown in FIG. 2 carry the same references.

Thus, the high-voltage latch HV1 comprises high-voltage memorization means for memorizing a binary data in the form of a high programming voltage VPP or a zero voltage. These high-voltage memorization means comprise two high-voltage inverters I1 and I2 in CMOS technology connected "head to tail" between a node A and a node B.

Figure 1:
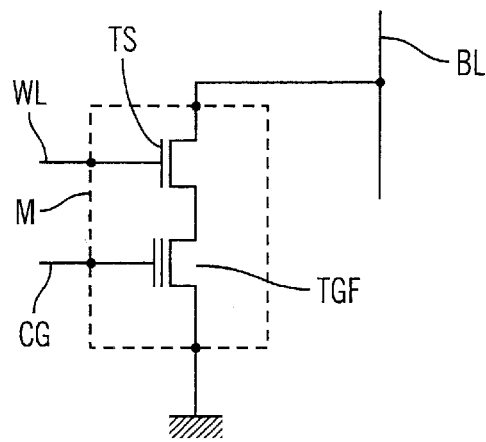
FIG. 1, already described above, is a diagram of a memory cell in EEPROM technology.
Figure 2:
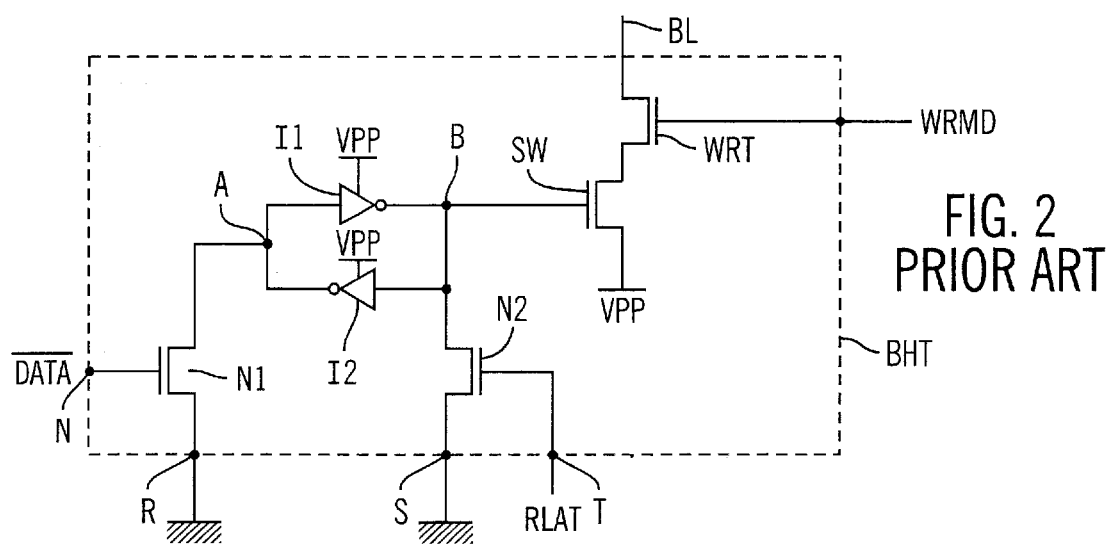
FIG. 2, already described above, is a diagram of a high voltage latch of a column register known in the state of the art.

In accordance with the invention, the high-voltage memorization means are coupled not to simple conditional switching means such as transistor SW in FIG. 2, but to conditional and selective switching means. By this term is meant the fact that such means enable to bring to a high programming voltage VPP, still in a conditional manner, a determined bit line among the two bit lines BL0 and BL1. These conditional and selective switching means comprise the transistor SW connected by its gate to the output B of the high-voltage memorization means I1, I2, to the high programming voltage Vpp by its drain and to the two bit lines BL0, BL1 via a respective N-type MOS transistor referenced WRT1 and WRT2 respectively. Transistors WRT1 and WRT2 form bit line selection means.

The gates of transistors WRT1 and WRT2 are respectively connected to the inputs U and V of the high-voltage latch to receive the selection signals WRMD1 and WRMD2 respectively. In this manner, transistors WRT1 and WRT2 provide both a function of isolating the bit lines in the readout mode (when the level of the two signals WRMD1 and WRMD2 is equal to zero), and a function of selecting one among the two bit lines BL0 and BL1 in the write mode (when the level of just one of these signals WRMD1 and WRMD2 is equal to VCC). We insist to note that transistors WRT1 and WRT2 not only continue to provide the isolation function that was attributed to them in the prior art high-voltage latches, but that, in addition, in accordance with the invention, they equally provide a selection function which adds to their known isolation function. In yet other words, transistors WRT1 and WRT2 cooperate with transistor SW to provide the conditional and selective switching function.

In addition, the high-voltage latch HV1 comprises first loading means for loading a binary data in the high-voltage memorization means I1, I2. These loading means comprise the transistors N1 and N2 already described with reference to FIG. 2, as well as the loading transistor TC1 discussed above with reference to FIG. 4. The operation of these means stems from what was said above in the above-mentioned passages and does not call for specific comments to one of ordinary skill in the art.

Each low voltage latch such as latch LV0 comprises low-voltage memorization means for memorizing a binary bit of a binary data in the form of a low-voltage supply VCC or a zero voltage. These low-voltage memorization means comprise two low-voltage inverters I3 and I4 in CMOS technology connected "head-to-tail" between a node C and a node D. A low-voltage inverter is an inverter which can receive and deliver a signal whose level is either zero or the low power supply voltage Vcc. By convention, the output of the low-voltage memorization means I3, I4 is taken from node D and their input on node C.

Low-voltage latch LV0 comprises second loading means for loading a binary data in the low voltage memorization mean I3, I4. These loading means comprise firstly an N-type MOS transistor referenced N3 connected by its drain to node C, by its gate to input M of latch LV0 to receive the signal D0 bar, and by its source to the drain of the first loading transistor TC1 (assimilated here to input R of the high-voltage latch HV1). Secondly, they comprise an N-type MOS transistor referenced N4, connected by its drain to node D, by its gate to input P of the latch to receive the reset-to-zero voltage RLAT1, and by its source to the drain of a memory word selection transistor (assimilated here to the input S of the high-voltage latch HV1). The operation of transistors N3 and N4 of the second loading means is identical respectively to that of transistors N1 and N2 of the first loading means described above with reference to FIG. 2. It therefore calls for no specific comment to the skilled person.

Note that the first and second loading means share at least the first loading transistor TC1, such that the first and second loading means can be activated simultaneously by means of the first loading signal LOAD1 which is applied to the gate of the first loading transistor TC1. This simultaneous activation has the effect of loading a first and a second binary data respectively in the low-voltage memorization means I3, I4 of the low-voltage latch and in the high-voltage memorization means I1, I2 of the high voltage latch, respectively as a function of signals D0 bar and D1 bar. On the other hand, the first and second loading means respond to respective reset-to-zero signals RLAT2 and RLAT1, as will appear more clearly in what follows.

The low-voltage latch LV0 also comprise coupling means at input A of one of the high-voltage latches, namely high-voltage latch HV1. These coupling means can be activated to load into high-voltage latch HV1 the binary data memorized in the low-voltage latch LV0. In other words, the binary data memorized by the low-voltage memorization means I3, I4 of the low voltage latch LV0 can be transferred into the high-voltage memorization means of the high-voltage latch HV1.

The coupling means of the low-voltage latch LV0 comprise an N-type MOS transistor designated N5 connected by its gate to the output D of the low-voltage memorization means I3, I4, by its drain to input A of the high-voltage memorization means I1, I2 of one of the high-voltage latches, namely high voltage latch HV1, and by its source to the input Q of the low-voltage latch. In this way, the coupling means are activated by the output of the low-voltage memorization means I3, I4 when the input Q is brought to ground in the manner explained above with reference to FIG. 4.

The operation of the column register of FIG. 4 shall now be described with reference to the timing charts of FIGS. 6a to 6h. These figures show the shape of the signals respectively COL, ERASE, WRMD1, WRMD2, RLAT1, LOAD1, RLAT2 and LOAD2 for a write operation in the memory. The logical implications between the different transitions of these signals is materialized by arrows. Signals COL, ERASE, RLAT1, LOAD1, RLAT2 and LOAD2 are low-voltage signals, i.e. their level is either zero or equal to VCC. Signals WRMD1 and WRMD2 are high-voltage signals, i.e. their level is either zero or equal to VPP.

A method of writing an eight-bit data word in the memory in accordance with the invention comprises the steps that shall now be described.

The method begins first of all with a step 1 of erasing all the cells of a memory word into which the binary word is to be written. This step begins with the transition to VCC of signal COL, which has the effect of making the selection transistor TS1 conducting. The memory word formed by memory cells M0 to M7 is then selected for writing. The ERASE signal then passes to VCC to command the memory erasure circuits (not shown), which enable to apply the required erasure voltages to the terminals of memory cells M0 to M7. This step 1 ends with the return to zero of the ERASE signal. Note that this erasure step 1 is not necessarily required if the memory is not a memory made in EEPROM technology.

The method then comprises a step 2 of loading four items of data into the four high-voltage latches HV1, HV3, HV5, and HV7, and of loading four other items of data into the low-voltage latches LV0, LV2, LV4 and LV6. The data thus loaded are the data inverse to the data to write in the memory word M0–M7, and are delivered by the signals D0 bar to D7 bar (FIG. 4).

Step 2 is divided into two stage. At a first stage, signals RLAT1 and RLAT2 pass to VCC so making conducting the transistor N4 of the low voltage latches LV0, LV2, LV4, and LV6 and the transistor N2 of the high-voltage latches HV1, HV3, HV5, and HV7 such that the data zero is memorized by their respective memorization means. At a second stage, the signals RLAT1 and RLAT2 return to zero, so blocking the above-mentioned transistors N4 and N2. The first loading signal LOAD1 then passes to VCC, which causes the loading transistor TC1 to be conductive, such that the data inverse to the data to be written, when they have binary values 1 delivered by the signals D0 bar to D7 bar (as the case arises in the form of signals having a level equal to VCC), are memorized in the respective memorization means of the high voltage latches HV1, HV3, HV5, and HV7 and of the low voltage latches LV0, LV2, LV4, and LV6. At the end of this stage, the data inverse to the data to be written, whether they be equal to 0 or to 1, are memorized in the respective memorization means I1, I2 and I3, I4 of the high-voltage latches and of the low-voltage latches. Stage 2 of loading ends by the reset-to-zero of the first loading signal LOAD1.

Note that the order of erasure step 1 and the loading step 2 can be reversed.

The process then comprises a step 3 of programming four memory cells of the memory as a function of the data memorized in the four high-voltage latches HV1, HV3, HV5, and HV7. In the example, the four cells concerned are the cells M0, M2, M4 and M6. To this end, the signal WRMD1 passes to VPP (while the signal WRMD2 remains at zero) so that the bit lines BL0, BL2, BL4 and BL6 are selected for writing. The conditional programming of the cells M0, M2, M4 and M6 then takes place by conditional switching of these bit lines to the high programming voltage VPP by means of transistors SW, as a function of data memorized in the high-voltage memorization means of the high-voltage cells HV1, HV3, HV5, and HV7. The programming step 3 ends by the return to zero of signal WRMD1, which has the effect of isolating once again the bit lines BL0, BL2, BL4 and BL6 from the high voltage VPP.

The process then comprises a step 4 of loading into the four high-voltage latches the voltage HV1, HV3, HV5, and HV7 of the four data that were previously loaded into the low-voltage latches LV0, LV2, LV4 and LV6 at step 2.

This step 4 is divided into two stages. At a first stage, the signal RLAT2 passes to VCC so making the transistor N2 of the high-voltage latches HV0, HV2, HV4 and HV6 conducting, so that the data 0 is memorized in their respective memorization means. At a second stage, the signal RLAT2 returns to zero, which blocks transistor N2. The second loading signal LOAD2 then passes to VCC, which makes the loading transistor TC2 conducting, so that the data memorized in the low-voltage memorization means I3, I4 of the low voltage latches LV0, LV2, LV4, and LV6, when they are equal to 1, are respectively loaded in the high-voltage memorization means I1, I2 of the high voltage latches respectively HV1, HV3, HV5, and HV7. In brief, at the end of this step, the binary data previously memorized in the low-voltage memorization means I3, I4 of the low voltage latches, whether they be equal to 0 or 1, are memorized in the high-voltage memorization means of the high-voltage latches. In other words, these data have been transferred at step 4 from the low-voltage memorization means I3, I4 of the low-voltage latches LV0, LV2, LV4 and LV6 to the high-voltage memorization means I1, I2 of the high voltage latches HV1, HV3, HV5, and HV7. Step 4 ends with the return to zero of the second loading signal LOAD2.

The method finally comprises a step 5 of programming four other cells of the memory as a function of the data memorized in the four high-voltage latches HV1, HV3, HV5, and HV7. In the example, the four cells concerned are cells M1, M3, M5 and M7. To this end, the signal WRMD2 passes to VCC (while the signal WRMD1 remains at zero) so that the bit lines BL1, BL3, BL5 and BL7 are selected for writing. The conditional programming of cells M1, M3, M5 and M7 then takes place by conditional switching of these bit lines to the high programming voltage VPP by means of transistors SW, as a function of data memorized in the high-voltage memorizing means HV1, HV3, HV5, and HV7. Programming step 5 ends by the return to zero of signal WRMD2, which has the effect of isolating again the bit lines BL1, BL3, BL5 and BL7 from the high voltage VPP.

Programming step 5 can possibly, but not necessarily, be followed by a step 6 of resetting to zero the respective memorization means I3, I4 and I1, I2 of low voltage latches LV0, LV2, LV4 and LV6 of the high voltage latches HV1, HV3, HV5, and HV7. To this end, the signals RLAT1 and RLAT2 pass to VCC which makes conducting the transistors N4 of the low-voltage latches LV0, LV2, LV4 and LV6 and the transistors N2 of the high-voltage latches HV1, HV3, HV5 and HV7 so that the binary data 0 is memorized in their respective memorization means I3, I4 and I1, I2.

The process of writing a data word in the memory word M0–M7 ends with the return to zero of the memory word selection signal COL.

Figure 3:
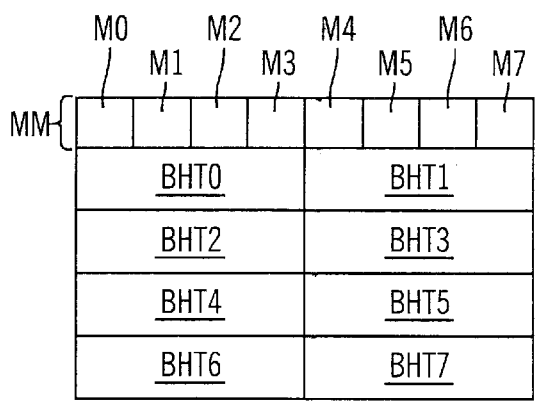
FIG. 3, also already described above, is a diagram of the surface area occupied by a memory word of one byte and by a corresponding column register according to the state of the art.
Figure 7:
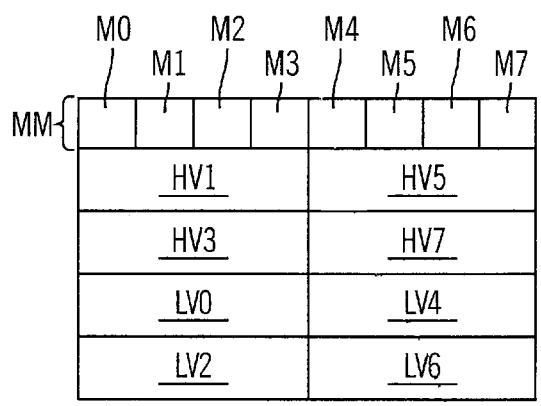
FIG. 7 is a diagram showing the area occupied by a memory word of one byte and by a corresponding column register in accordance with the invention.

FIG. 7 shows schematically the area occupied by a memory plane MM of one byte comprising the eight memory cells M0 to M7 forming a memory word and area occupied by the four high-voltage latches HV1, HV3, HV5 and HV7 as well as the four low-voltage latches LV0, LV2, LV4 and LV6. Comparing this figure with FIG. 3, we note that the area occupied by a column register according to the invention is less than that occupied by a prior art column register. This comes from the fact area occupied by a low-voltage latch is less than that occupied by a high-voltage latch.

The invention has only been described above for the non-limiting example of a case in which a column register comprises, for a memory word of eight memory cells, four high-voltage latches and four low-voltage latches. Nevertheless, it can be generalized of a column register comprising, for a memory word comprising $2^p$ memory cells each connected to a Respective bit line, where p is a non zero whole number, $2^q$ high-voltage latches, where q is a whole number less than p, and $2^p-2^q$ low-voltage latches. Note that the smaller is the value of q, the higher is the gain in silicon area compared to a register of the prior art.

In this case, the high-voltage latch selection means allow to select a bit line determined among $2^{p-q}$ bit lines. To this end, it is necessary to provide for each one $2^{p-q}$ transistors such as the selection transistors WRT1 and WRT2 and as many selection signals such as signals WRMD1 and WRMD2. Moreover, several low-voltage latches are connected by the drain of their coupling transistor N5 to the input A of a same high-voltage latch. It is therefore necessary to provide $2^{p-q}-1$ loading transistors such as transistor TC1.

Also, the loading step 2 then concerns the loading of $2^q$ data into $2^q$ high-voltage latches, and the loading of $2^p-2^q$ other data in the $2^p-2^q$ low voltage latches. Likewise, programming step 3 then concerns the programming of $2^q$ cells of the memory as a function of the data memorized in the $2^q$ high-voltage latches. Moreover, loading step 4 and programming step 5 are then repeated $2^{p-q}-1$ times. Loading step 4 then concerns the loading, in the $2^q$ high-voltage latches, of $2^q$ of the other data that were previously loaded into the $2^q$ low voltage latches at loading step 2. Finally, the programming step 5 then concerns the programming of the $2^q$ other cells of the memory as a function of the data memorized in the $2^q$ high-voltage latches.

With these general expressions, it will be understood that the embodiment described above is a specific embodiment in which p is equal to 3 and q is equal to 2.

Also, it is possible to carry out steps 1) and/or 3) to 5) simultaneously for several or all of the memory words of a same line of memory cells of the memory, when the memory comprises such a plurality of memory words per line.

In this case, there should be provided as many selection transistors and memory word selection signals, such as respectively transistor TS1 and the signal COL, as there are memory words in the line. However, the reset-to-zero RLAT1 and RLAT2, the loading signals LOAD1 and LOAD2, and the selection signals WRMD1 and WRMD2 can be supplied as they are at the respective inputs of the latches of each column register comprised in the memory. There is thus provided the possibility of writing in the page mode in accordance with the teachings of the invention.

Note that it does not seem possible to envision implementing loading step 2 simultaneously for several or even all the memory words of a same line of cells of the memory. Indeed, that would call for means for storing data inverse to the data to be written, which are specific to each memory word, and that would increase the number and length of connection lines necessary for conveying these data to the M and N inputs of the low-voltage and high-voltage latches respectively.

While there has been illustrated and described what are presently considered to be the preferred embodiments of the present invention, it will be understood by those of ordinary skill in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of writing at least one data word of $2^p$ bits in a memory, the memory comprising a memory plane with at least one memory word of $2^p$ cells, each connected to a respective bit line, and wherein the memory plane comprises a column register comprising $2^q$ high-voltage latches and $2^p-2^q$ low-voltage latches, where p is a non-zero whole number and where q is a whole number less than p, each of the high-voltage latches comprising high-voltage memorization means for memorizing a binary data and each of the low-voltage latches comprising low-voltage memorization means for memorizing a binary data, the method comprising the following steps:

1) erasing all the cells of a memory word;
2) loading $2^q$ data in the $2^q$ high-voltage latches, and loading $2^p-2^q$ other data in the $2^p-2^q$ low-voltage latches; and
3) programming $2^q$ cells of the memory as a function of the data memorized in the $2^q$ high-voltage latches;

as well as repeating $2^{p-q}-1$ times the following steps:

4) loading, in the $2^q$ high-voltage latches, of $2^q$ of the other data that were loaded in $2^q$ low-voltage latches at step 2); and
5) programming $2^q$ other cells of the memory as a function of the data memorized in the $2^q$ high-voltage latches.

2. The method according to claim 1, wherein p is equal to 3 and wherein q is equal to 2.

3. The method according to claim 1, wherein steps 1) and/or 3) to 5) are implemented simultaneously for several or the totality of the memory words of a same line of cells of the memory.

4. The method according to claim 1, wherein the programming step 5) is followed by a step 6) of resetting to zero the respective memorization means of the low-voltage latches and of the high-voltage latches.

5. The method according to claim 4, wherein steps 1) and/or 3) to 5) are implemented simultaneously for several or the totality of the memory words of a same line of cells of the memory.

6. The method according to claim 4, wherein p is equal to 3 and wherein q is equal to 2.

7. The method according to claim 6, wherein steps 1) and/or 3) to 5) are implemented simultaneously for several or the totality of the memory words of a same line of cells of the memory.

* * * * *